United States Patent
Grube et al.

(10) Patent No.: US 11,334,425 B1
(45) Date of Patent: *May 17, 2022

(54) TRANSMITTING SYNCHRONIZED DATA STREAMS IN A DISTRIBUTED STORAGE NETWORK

(71) Applicant: Pure Storage, Inc., Mountain View, CA (US)

(72) Inventors: Gary W. Grube, Barrington Hills, IL (US); Timothy W. Markison, Mesa, AZ (US)

(73) Assignee: PURE STORAGE, INC., Mountain View, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 16/921,451

(22) Filed: Jul. 6, 2020

Related U.S. Application Data

(63) Continuation of application No. 16/279,172, filed on Feb. 19, 2019, now abandoned, which is a
(Continued)

(51) Int. Cl.
*G01R 31/28* (2006.01)
*G06F 11/10* (2006.01)
(Continued)

(52) U.S. Cl.
CPC .......... *G06F 11/10* (2013.01); *G06F 11/1076* (2013.01); *G06F 16/24568* (2019.01);
(Continued)

(58) Field of Classification Search
CPC ................. G06F 11/10; G06F 11/1076; G06F 17/30516; H03M 13/1148; H03M 13/3761; H03M 13/35; H04L 65/607; H04L 65/605
See application file for complete search history.

(56) References Cited

U.S. PATENT DOCUMENTS

| | | | |
|---|---|---|---|
| 4,092,732 A | 5/1978 | Ouchi | |
| 5,454,101 A | 9/1995 | Mackay et al. | |

(Continued)

OTHER PUBLICATIONS

Chung; An Automatic Data Segmentation Method for 3D Measured Data Points; National Taiwan University; pp. 1-8; 1998.
(Continued)

*Primary Examiner* — Samir W Rizk
(74) *Attorney, Agent, or Firm* — Garlick & Markison; Timothy W. Markison; Kelly H. Hale

(57) ABSTRACT

A method begins by a processing module of a storage network receiving a first plurality of pairs of coded values corresponding to first data segments of a first data stream and a second data stream. The method continues with the processing module generating a received coded matrix to include a plurality of groups of selected coded values and when the received coded matrix includes a decode threshold number of pairs of coded values, generating a data matrix from the received coded matrix and an encoding matrix. The method continues with the processing module reproducing the first data segment of the first and second data streams, while maintaining the time alignment of the first and second data streams.

19 Claims, 8 Drawing Sheets

| slice name 80 ||||| 
|---|---|---|---|---|
| pillar # | data segment # | vault ID | data object ID | rev. info |

Related U.S. Application Data continuation-in-part of application No. 15/629,134, filed on Jun. 21, 2017, now Pat. No. 10,235,237, which is a continuation-in-part of application No. 14/954,836, filed on Nov. 30, 2015, now Pat. No. 9,715,425, which is a continuation of application No. 13/565,636, filed on Aug. 2, 2012, now Pat. No. 9,213,742.

(60) Provisional application No. 61/531,317, filed on Sep. 6, 2011.

(51) Int. Cl.
  *G06F 16/2455* (2019.01)
  *H04L 65/60* (2022.01)
  *H03M 13/00* (2006.01)
  *H03M 13/37* (2006.01)
  *H03M 13/15* (2006.01)
  *H03M 13/11* (2006.01)

(52) U.S. Cl.
  CPC ... *H03M 13/1148* (2013.01); *H03M 13/1515* (2013.01); *H03M 13/373* (2013.01); *H03M 13/616* (2013.01); *H04L 65/605* (2013.01); *H04L 65/607* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,070,003 | A | 5/2000 | Gove et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,103,824 | B2 | 9/2006 | Halford |
| 7,103,915 | B2 | 9/2006 | Redlich et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,636,724 | B2 | 12/2009 | de la Torre et al. |
| 8,532,212 | B2 | 9/2013 | Ito |
| 8,751,894 | B2 * | 6/2014 | Grube ............... G06F 16/24568 714/755 |
| 10,298,683 | B2 | 5/2019 | Litvinsky et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0105724 | A1 | 5/2006 | Nakao |
| 2006/0136448 | A1 | 6/2006 | Cialini et al. |
| 2006/0147219 | A1 | 7/2006 | Koshino et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2010/0091842 | A1 | 4/2010 | Ikeda et al. |
| 2010/0180176 | A1 | 7/2010 | Yosoku et al. |
| 2010/0287200 | A1 | 11/2010 | Dhuse |
| 2011/0053639 | A1 | 3/2011 | Etienne Suanez et al. |
| 2012/0051208 | A1 | 3/2012 | Li et al. |
| 2012/0106595 | A1 | 5/2012 | Bhattad et al. |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

(56) References Cited

OTHER PUBLICATIONS

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

\* cited by examiner

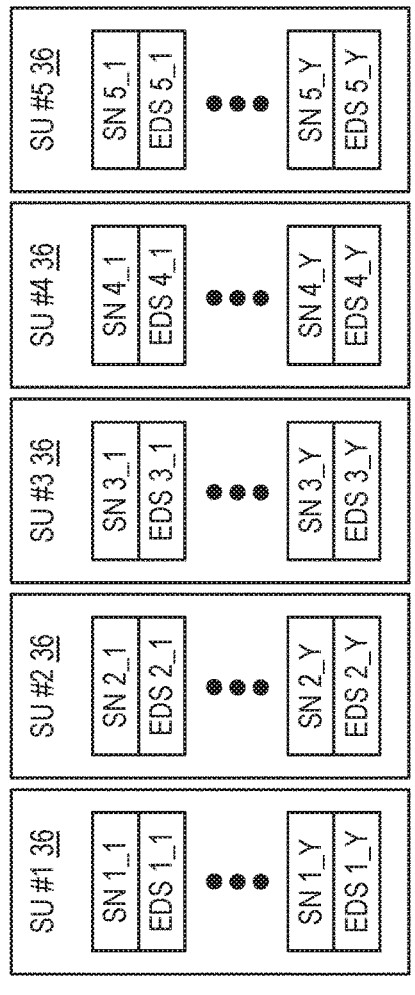
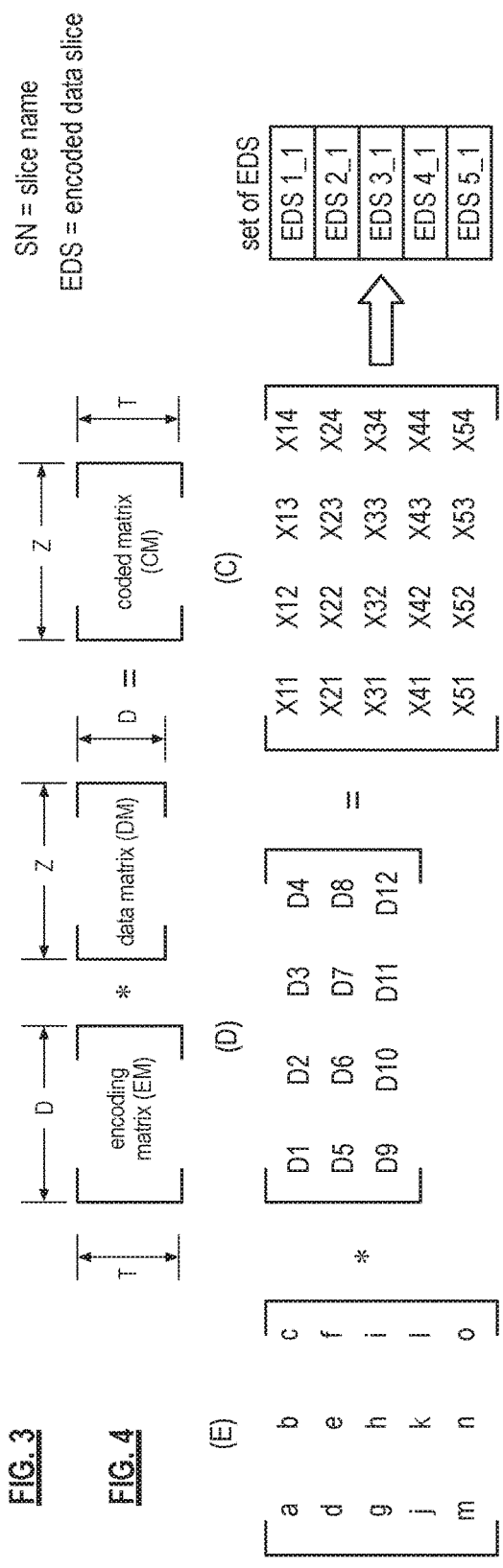

FIG. 11

TRANSMITTING SYNCHRONIZED DATA STREAMS IN A DISTRIBUTED STORAGE NETWORK

The present U.S. Utility patent application claims priority pursuant to 35 U.S.C. § 120 as a continuation of U.S. Utility application Ser. No. 16/279,172, entitled "DEMULTIPLEXING DECODED DATA STREAMS IN A DISTRIBUTED STORAGE NETWORK", filed Feb. 19, 2019, which is a continuation-in-part of U.S. Utility application Ser. No. 15/629,134, entitled "DECODING DATA STREAMS IN A DISTRIBUTED STORAGE NETWORK", filed Jun. 21, 2017, issued as U.S. Pat. No. 10,235,237 on Mar. 19, 2019, which is a continuation-in-part of U.S. Utility application Ser. No. 14/954,836, entitled "TIME ALIGNED TRANSMISSION OF CONCURRENTLY CODED DATA STREAMS", filed Nov. 30, 2015, issued as U.S. Pat. No. 9,715,425 on Jul. 25, 2017, which is a continuation of U.S. Utility patent application Ser. No. 13/565,636, entitled "TIME ALIGNED TRANSMISSION OF CONCURRENTLY CODED DATA STREAMS", filed Aug. 2, 2012, issued as U.S. Pat. No. 9,213,742 on Dec. 15, 2015, which claims priority pursuant to 35 U.S.C. § 119(e) to U.S. Provisional Application No. 61/531,317, entitled "COMMUNICATING ONE OR MORE DATA STREAMS UTILIZING DISPERSED STORAGE ERROR ENCODING", filed Sep. 6, 2011, all of which are hereby incorporated herein by reference in their entirety and made part of the present U.S. Utility patent application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 11 is a diagram illustrating an example of a data decoding scheme for decoding a received slice matrix to produce an intermediate matrix in accordance with the present invention.

DETAILED DESCRIPTION OF THE INVENTION

Figure 1:
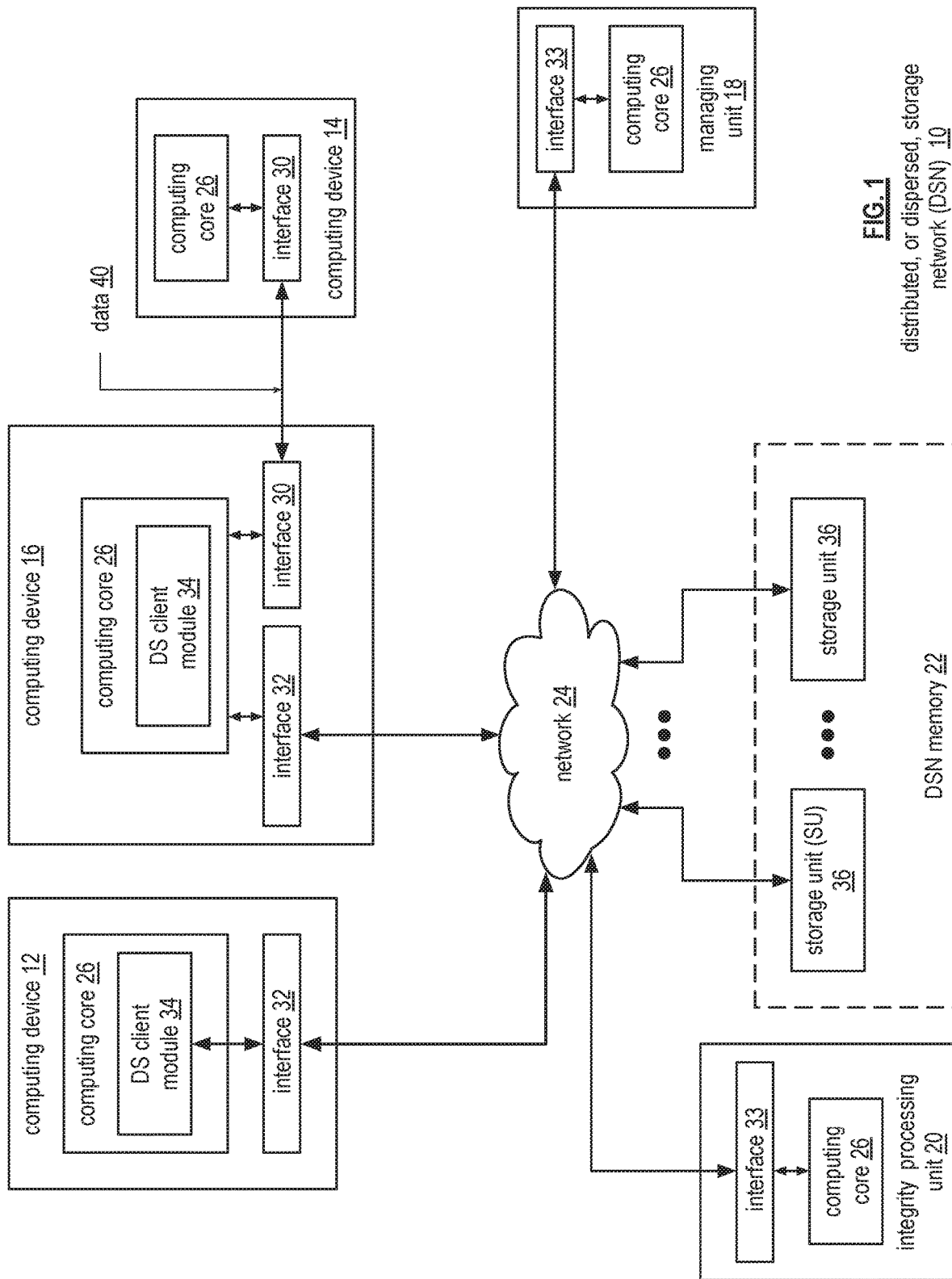
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
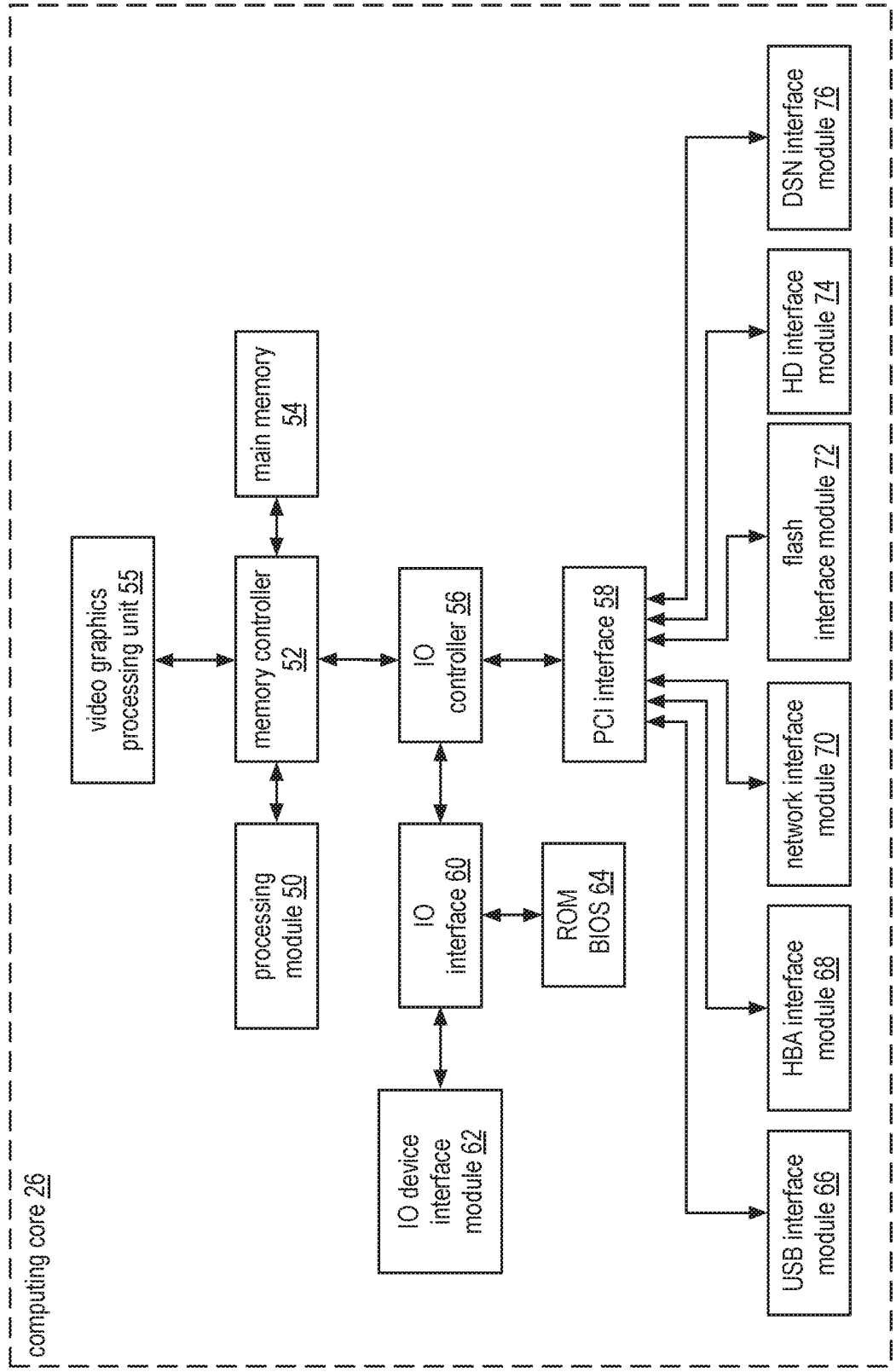
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an 10 interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
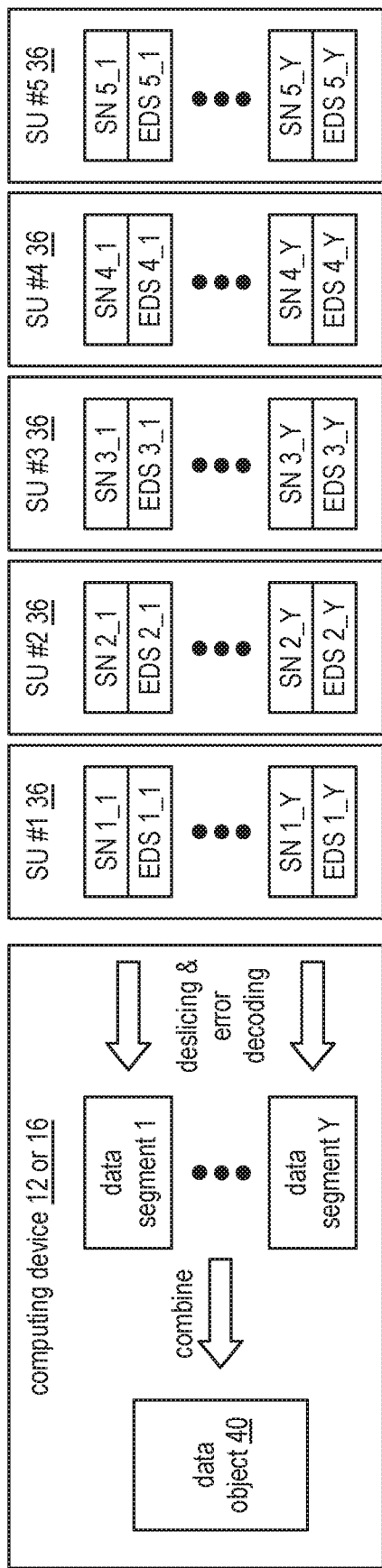
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
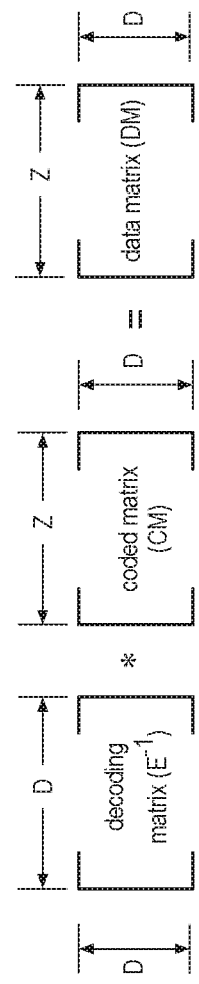
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
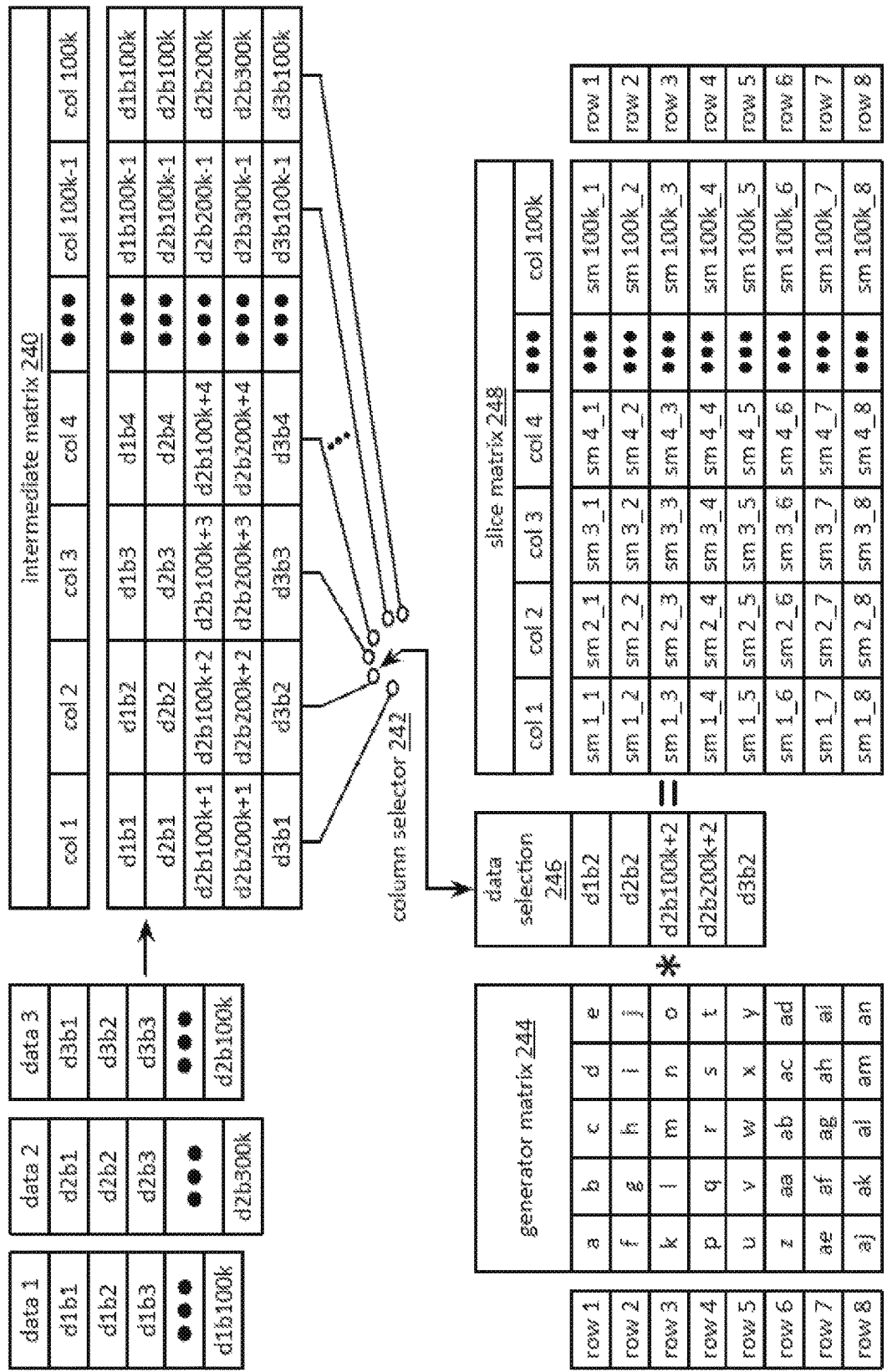
FIG. 9 is a diagram illustrating an example of a data encoding scheme in accordance with the present invention.

FIG. 9 is a diagram illustrating an example of a data encoding scheme. The scheme includes data 1, data 2, data 3, an intermediate matrix 240, a column selector 242, a generator matrix 244, a data selection 246, and a slice matrix tuner 48. The data 1-3 includes two or more pluralities of data bytes. For example, data 1 includes 100,000 bytes d1b1-d1b100k, data 2 includes 300,000 bytes d2b1-d2b100k, and data 3 includes 100,000 bytes d3b1-d3b100k. The intermediate matrix 240 includes matrix dimensions (e.g., number of rows, number of columns) based on a size of data 1-3 and error coding dispersal storage function parameters (e.g., a decode threshold). For example, the intermediate matrix includes five rows and 100,000 columns, when the error coding dispersal storage function parameters includes a decode threshold of five and a data 1-3 size increment of 100,000 bytes each (e.g., columns=data 1, 3 size). The intermediate matrix 240 includes alternating entries between data 1, data 2, and data 3 of sequential data bytes of data 1-3 in a row-by-row fashion. For example, row 1 starts with data 1 and includes bytes d1b1-d1b100k, row 2 alternates to data 2 and includes bytes d2b1-d2b100k, row 2 continues with data 2 and includes bytes d2b100k+1-d2b200k, row 3 continues with data 2 and includes bytes d2b200k+1-d2b300k, and row 3 alternates to data 3 and includes bytes d3b1-d3b100k. The alternating encoding scheme facilitates subsequent time synchronization between data 1-3.

The generator matrix 244 includes matrix dimensions based on the error coding dispersal storage function parameters (e.g., the decode threshold, a width). For example, the generator matrix 244 includes five columns and eight rows when the decode threshold is five and the pillar width is eight. The generator matrix 244 includes entries in accordance with an error coding dispersal storage function to produce encoded data slices such that at least a decode threshold number of encoded data slices may be utilized to subsequently reproduce the data.

The data selection 246 includes matrix dimensions of one by the decode threshold (e.g., one by five when the decode threshold is five). The column selector 242 forms entries of the data selection 246 based on selecting data of each column of the intermediate matrix 240 one by one. For example, the column selector to 242 selects a second selection of column 2 to include bytes d1b2, d2b2, d2b100k+2, d2b200k+2, and d3b2.

The slice matrix 248 includes matrix dimensions of a pillar width number of rows (e.g., pillars) and a number of columns is substantially the same as the number of columns of the intermediate matrix 240. The slice matrix 248 includes entries that form a pillar width number (e.g., a number of rows of the slice matrix) of encoded data slices. The encoded data slice of the width number of encoded data slices includes between one and a number of bytes substantially the same as the number of columns of the intermediate matrix 240. For example, each encoded data slice includes one byte when the slices correspond to one column of the slice matrix 248. As another example, each encoded data slice includes 100,000 bytes when the slices correspond to all columns of the slice matrix 248.

In an example of operation, the column selector 242 selects one column of the intermediate matrix 240 at a time to produce a data selection 246 of a plurality of data selections. The generator matrix 244 is multiplied by each data selection 246 of the plurality of data selections to produce a corresponding column of a plurality of columns of the slice matrix 248. For example, sm 1_1=a*d1b1+b*d2b1+c*(d2b100k+1)+d*(d2b200k+1)+e*d3b1 when the column selector 242 selects a first column. As another example, sm 2_8=aj*d1b2+ak*d2b2+al*(d2b100k+2)+am*(d2b200k+2)+an*d3b2 when the column selector 242 selects a second column.

Slices may be formed from the slice matrix 248 and transmitted to at least one receiving entity to provide a reliable transmission of the data 1-2. Slices are aligned by row and may include any number of bytes of the corresponding columns. For example, a pillar 1 (e.g., row 1) slice includes bytes sm 1_1, sm 2_1, sm 3_1, and sm 4_1 when four bytes may be transmitted together as one slice. Slices from at least a decode threshold number of rows are to be transmitted such that corresponding data selections may be reproduced by decoding a decode threshold number of bytes corresponding to a common column. More than a decode threshold number of bytes per column may be transmitted when at least one of the decode threshold number of bytes was not received by at least one receiving entity. For example, bytes of column 1 corresponding to rows 1-5 are transmitted as a first transmitting step and all bytes except the byte of row 3 are received by the receiving entity. Any one of bytes corresponding to rows 3, 6-8 may be transmitted as a second transmitting step to the receiving entity such that the receiving entity completes receiving a decode threshold number of bytes corresponding to column 1. The method of operation of a transmitting entity is discussed in greater detail with reference to FIG. 12.

Figure 10:
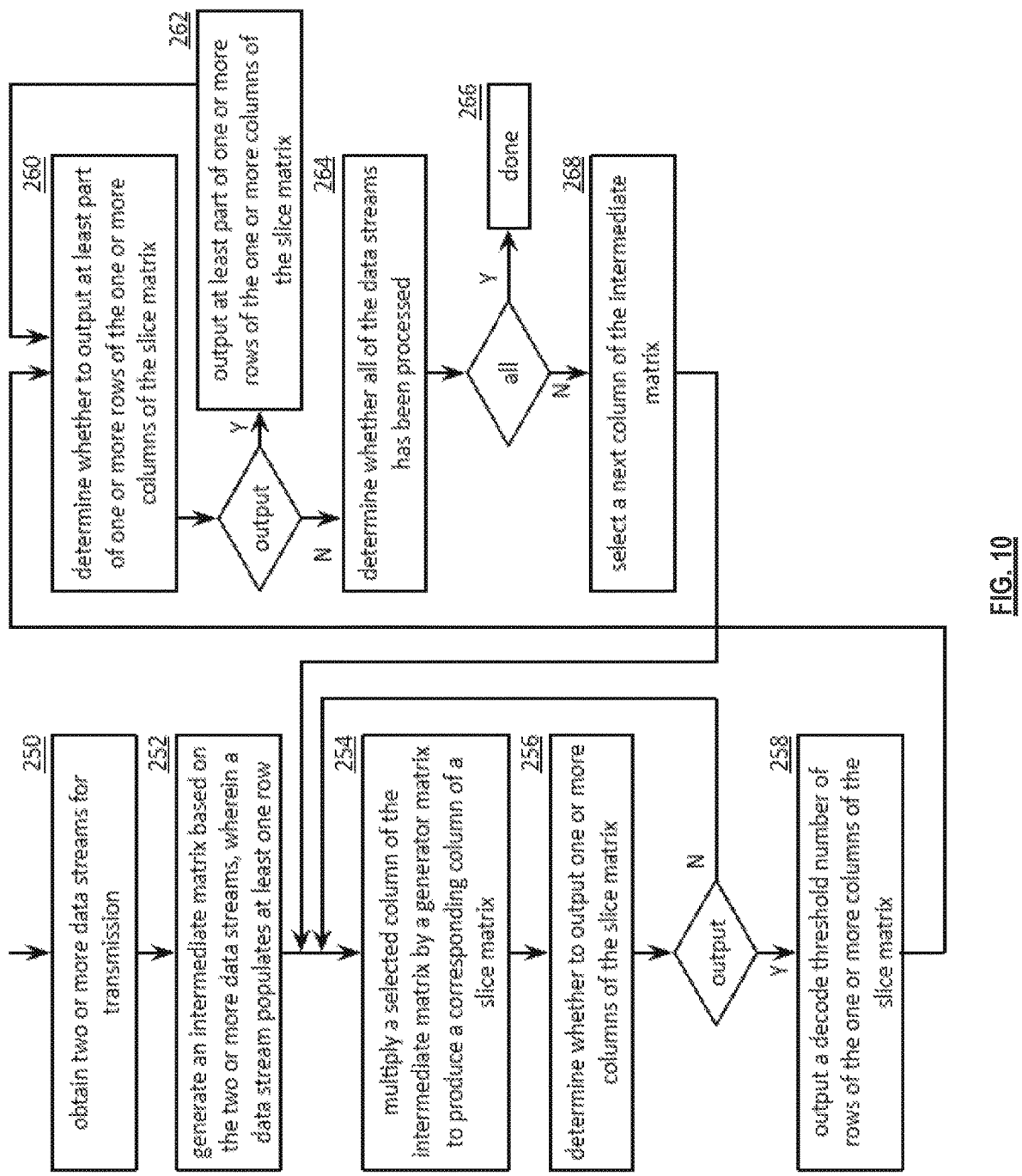
FIG. 10 is a logic diagram of an example of sending data in accordance with the present invention.

FIG. 10 is a flowchart illustrating an example of sending data. The method begins at step 250 where a processing module (e.g., a transmitting entity such as a sending user device dispersed storage (DS) processing) obtains two or more data streams for transmission (e.g., receive, generate). The method continues at step 252 where the processing module generates an intermediate matrix based on the two or more data streams, wherein each data stream populates a set of rows. For example, the processing module generates the intermediate matrix by filling in successive rows from left to right of the intermediate matrix from bytes of each of the two or more data streams one data stream at a time.

The method continues at step 254 where the processing module matrix multiplies a selected column of the intermediate matrix by a generator matrix to produce a corresponding column of a slice matrix. The method continues at step 256 where the processing module determines whether to output one or more columns of the slice matrix based on one or more of a predetermination, a request, and a registry lookup. The method repeats back to step 254 when the processing module determines not to output the one or more columns of the slice matrix. The method continues to step 258 when the processing module determines to output the one or more columns of the slice matrix.

The method continues at step 258 where the processing module outputs a decode threshold number of rows of the one more columns of the slice matrix when the processing module determines to output the one or more columns of the slice matrix. The method continues at step 260 where the processing module determines whether to output at least part of one or more rows of the one or more columns of the slice matrix. The determination may be based on one or more of previous outputting, a predetermination, and a request. The method branches to step 264 when the processing module determines not to output the at least part of the one or more rows of the one or more columns of the slice matrix. The method continues to step 262 when the processing module determines to output the at least part of the one or more rows of the one or more columns of the slice matrix. The method continues at step 262 where the processing module outputs at least part of the one or more rows of the one or more columns of the slice matrix. The outputting may include sending integrity information corresponding to each decode threshold number of bytes of a common column (e.g., a data selection/data segment). The method loops back to step 260.

The method continues at step 264 where the processing module determines whether all the data streams have been processed based on a record of outputting. The method branches to step 268 when the processing module determines that not all of the data streams have been processed. The method concludes at step 266 when the processing module determines that all the data streams have been processed. The method continues at step 268 where the processing module selects a next column of the intermediate matrix based on previous columns sent. The method branches back to step 254.

Figure 11:
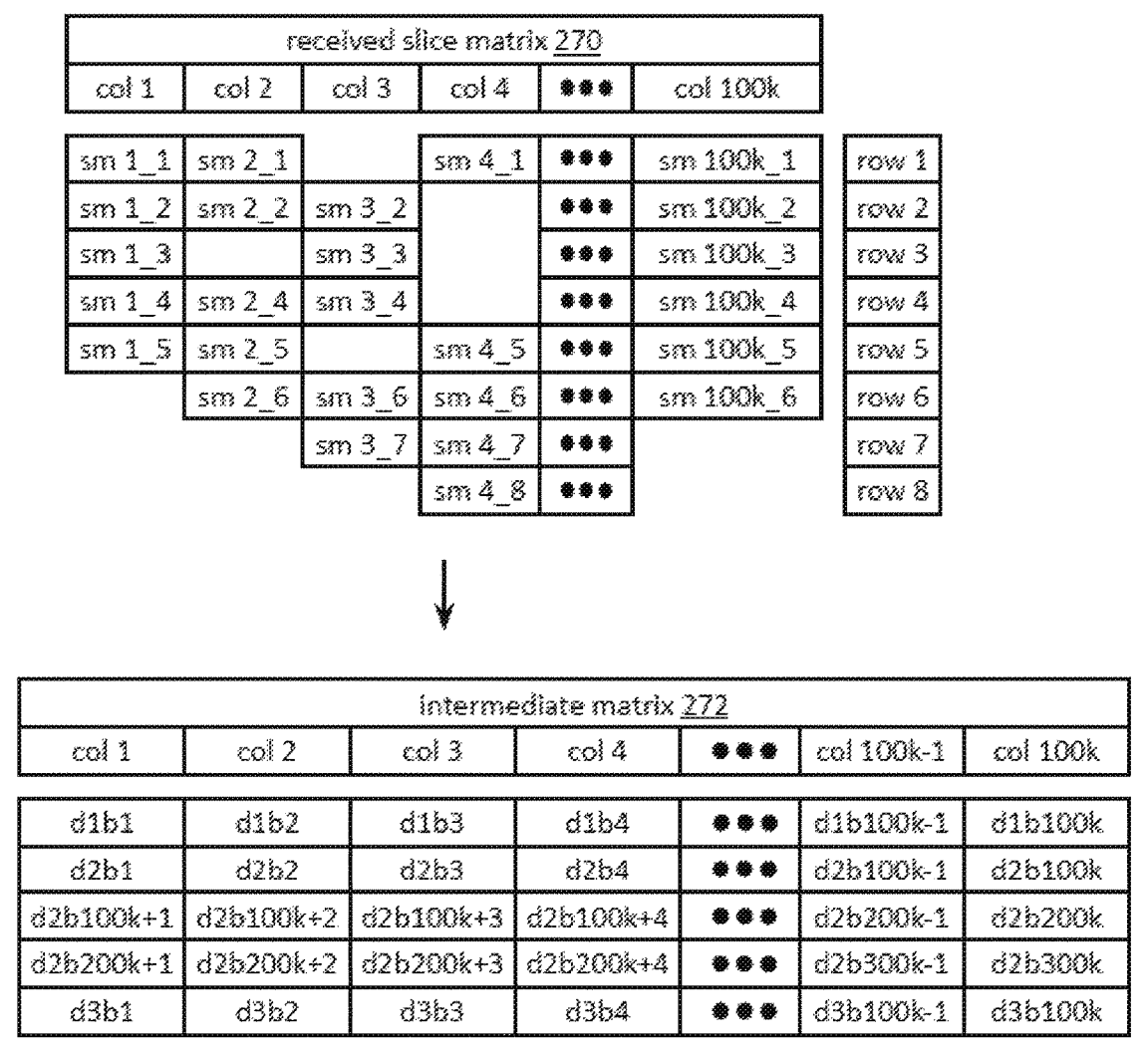

FIG. 11 is a diagram illustrating an example of a data decoding scheme for decoding a received slice matrix 270 to produce an intermediate matrix 272. The received slice matrix 270 may be generated by a receiving entity receiving a plurality of slices from a sending entity, extracting one or more bytes from each slice of the plurality of slices, and populating the received slice matrix with the one or more bytes in accordance with a decoding scheme. For example, the received slice matrix 270 is approximately the same as a slice matrix with the exception of missing bytes due to communication errors. The receiving entity identifies one or more missing bytes and sends a message to the sending entity to send one or more additional bytes per column such that a decode threshold number of bytes per column are successfully received.

The receiving entity analyzes each column of the received slice matrix 270 to determine a message to send to the sending entity. For example, the receiving entity sends a message to the sending entity indicating that no more bytes corresponding to column 1 are required when bytes sm 1_1 through sm 1_5 were successfully received and validated (e.g., calculated integrity information favorably compares to sent integrity information). As another example, the receiving entity sends a message to the sending entity indicating that one additional byte corresponding to column 2 is required when bytes sm 2_1, sm 2_2, sm 2_4, and sm 2_5 were successfully received. Next, the receiving entity receives byte sm 2_6 corresponding to column 2 to complete a decode threshold number of bytes corresponding to column 2. Similarly, the receiving entity acquires bytes 6 and 7 of column 3 in a second receiving step when bytes 1 and 5 were missing from a first receiving step. As yet another example, the receiving entity sends a message to the sending entity indicating that at least one additional byte corresponding to column 100k is required since bytes 1-5 of column 100k produced a decoded data segment that failed an integrity test. Next, the receiving entity receives byte sm 100k_6 to utilize in combination with bytes 1-5 to attempt to decode a data segment that passes the integrity test. For each column of the received slice matrix 270, a decode threshold number of bytes are dispersed storage error decoded to produce a corresponding column of the intermediate matrix 272. The method of operation of the receiving entity is discussed in greater detail with reference to FIG. 12.

Figure 12:
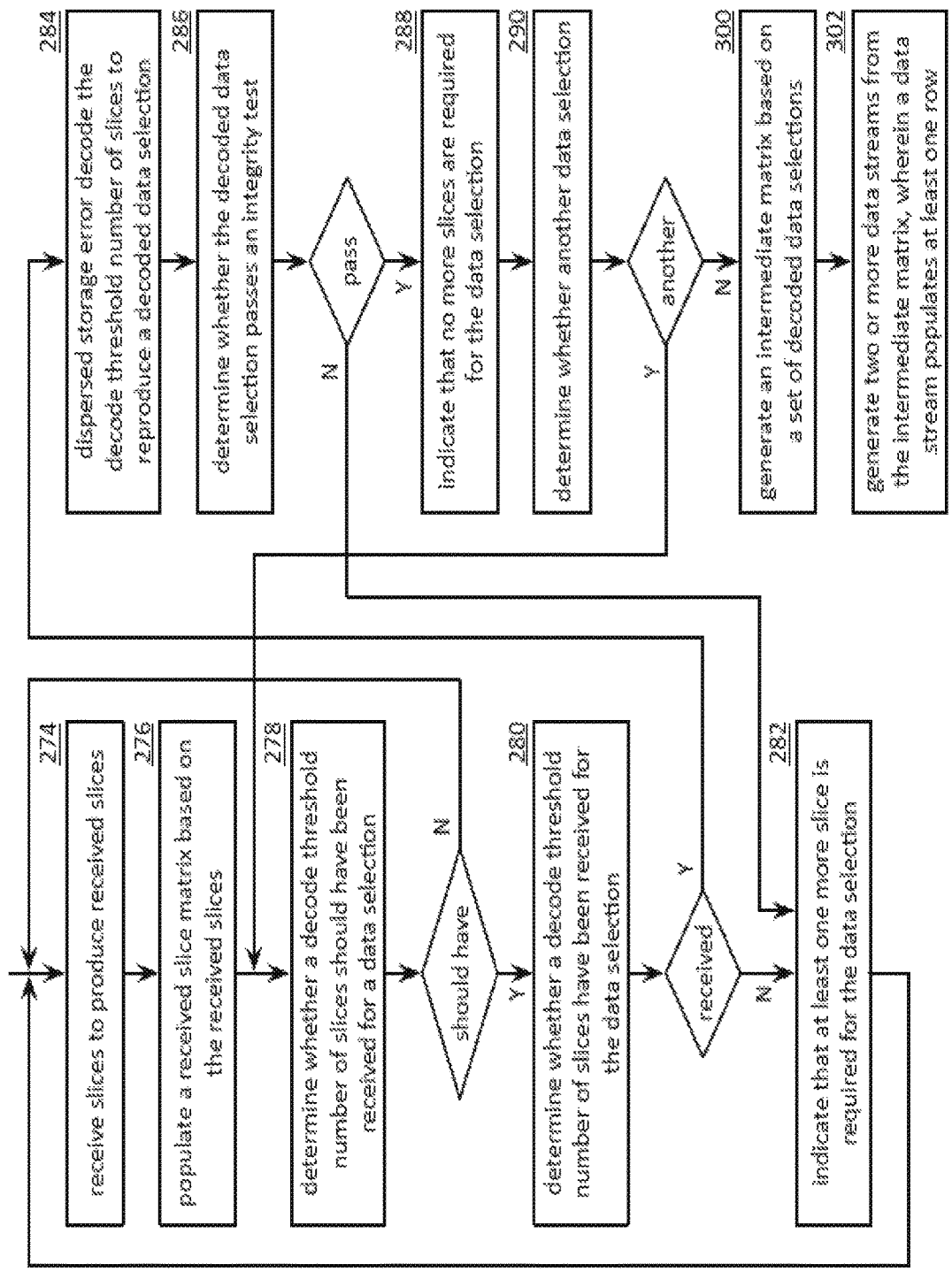
FIG. 12 is a logic diagram of an example of receiving data in accordance with the present invention.

FIG. 12 is a logic diagram illustrating an example of receiving data. The method begins at step 274 where a processing module (e.g., a receiving entity such as a receiving user device dispersed storage (DS) processing) receives slices to produce received slices. The method continues at step 276 where the processing module populates a received slice matrix with the received slices.

The method continues at step 278 where the processing module determines whether a decode threshold number of slices should have been received for a data selection. The data selection includes data bytes associated with two or more data streams rather than a data segment associated with one data stream. The determination may be based on one or more of comparing a count of a number of bytes per column to the decode threshold number, comparing a count of a number of byte positions per column to the decode threshold number, received slice names, and a decode threshold number indicator. For example, processing module determines that the decode threshold number of slices should have been received for a data selection when a slice count indicates that the decode threshold number of bytes was received. The method branches to step 280 when the processing module determines that the decode threshold number of slices should have been received. The method repeats back to step 274 when the decode threshold number of slices should not have been received so far.

The method continues at step 280 where the processing module determines whether the decode threshold number of slices have been received for the data selection. The processing module may determine that the decode threshold number of slices have been received for the data selection when a comparison of the number of received bytes of a common column of the received slice matrix to the decode threshold number is favorable (e.g., substantially the same). The method branches to step 284 when the processing module determines that the decode threshold number of slices have been received for the data selection. The method continues to step 282 when the processing module determines that the decode threshold number of slices have not been received for the data selection.

The method continues at step 282 where the processing module indicates that at least one more slice is required for the data segment. The indication includes at least one of identifying which at least one more slice is required based on which slices have been received so far and which slices have not been sent so far (e.g., higher order rows of higher order pillars) and sending a message to the sending entity that includes identification of at least one more required slice. The indication may include identification of one more bytes that are required corresponding to each of the at least one more required slice. The method repeats back to step 274.

The method continues at step 284 where the processing module dispersed storage error decodes the decode threshold number of slices to reproduce a decoded data selection when the processing module determines that the decode threshold number of slices have been received for the data selection. The processing module decodes available bytes of a common column of the received slice matrix corresponding to the data selection.

The method continues at step 286 where the processing module determines whether the decoded data segment passes an integrity test. For example, the processing module indicates passing the integrity test when a calculated integrity value (e.g., one of a hash digest of the data selection, a cyclic redundancy check of the data selection, and a mask generating function output of the data selection) compares favorably (e.g., substantially the same) to a received integrity value associated with the data selection. The method loops back to step 282 when the processing module determines that the decoded data selection does not pass the integrity test. The method continues to step 288 when the processing module determines that the decoded data selection passes the integrity test.

The method continues at step 288 where the processing module indicates that no more slices are required for the data selection. The indication includes at least one of sending a message to the sending entity that indicates that no more slices are required for the column corresponding to the data selection, storing the decode threshold number of slices in a dispersed storage network (DSN) memory, dispersed storage error encoding the data selection to reproduce a full set of slices, storing the full set of slices in the DSN memory, and sending the full set of slices to a remote user device.

The method continues at step 290 where the process module determines whether another data selection is to be reproduced. The determination may be based on one or more of verifying that each column of the received slice matrix is associated with a corresponding data selection that passes the integrity test. The method repeats back to step 278 when the processing module determines that another data selection is to be reproduced. The method continues to step 300 when the processing module determines that another data selection is not to be reproduced.

The method continues at step 300 where the processing module generates an intermediate matrix based on a set of decoded data selections decoded from each column of the received slice matrix. For example, the processing module populates each column of the intermediate matrix with a corresponding data selection of the set of decoded data selections. The method continues at step 302 where the processing module generates two or more data streams from the intermediate matrix, wherein a data stream populates at least one row. For example, the processing module partitions a first row of the intermediate matrix to produce a first data stream; a second, third, and fourth row to produce a second data stream; and a fifth row to produce a third data stream.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a storage network (SN), the method comprises:
    receiving a first plurality of pairs of coded values corresponding to a first plurality of data segments of a first data stream and a second data stream, wherein a pair of coded values of the first plurality of pairs of coded values includes a first coded value corresponding to the first data segment of the first data stream and a second coded value corresponding to the first data segment of the second data stream, wherein the first data segments of the first, second data streams are time aligned;
    creating a received coded matrix from the plurality of groups of selected coded values, wherein one of the plurality of groups of selected coded values includes at least the first and second coded values; and
    when the received coded matrix includes a decode threshold number of pairs of coded values:
    generating a data matrix from the received coded matrix and an encoding matrix;
    reproducing the first data segment of the first data stream from a first plurality of data blocks of the data matrix; and reproducing the first data segment of the second data stream from a second plurality of data blocks of the data matrix, wherein the first data segment of the first data stream and the first data segment of the second data stream maintain the time alignment of the first and second data streams.

2. The method of claim 1 further comprises:
generating the received coded matrix based on a request from a requesting entity.

3. The method of claim 1 further comprises:
generating the received coded matrix based on capabilities of a requesting entity.

4. The method of claim 1 further comprises:
the first data stream corresponding to a first recording of an environment from a first recording device; and
the second data stream corresponding to a second recording of the environment from the first recording device.

5. The method of claim 1 further comprises:
determining the time alignment of the first data segments of the first and second data streams by at least one of:
interpreting time-stamp information; and
interpreting identification information of the first data segment of the first and second data streams.

6. The method of claim 1 further comprises:
receiving a request from a requesting entity for one or more additional groups of selected coded values;
generating the one or more additional groups of selected coded values utilizing the received coded matrix; and
outputting the one or more additional groups of selected coded values to the requesting entity.

7. The method of claim 1, wherein the first data segment of the first data stream is divided into a first plurality of data blocks and the first data segment of the second data stream is divided into a second plurality of data blocks, wherein the first and second plurality of data blocks create the data matrix.

8. A storage module of a storage network comprises:
a first module, when operable within a computing device, causes the computing device to:
receive a first plurality of pairs of coded values corresponding to first data segments of a first data stream and a second data stream, wherein a pair of coded values of the first plurality of pairs of coded values includes a first coded value corresponding to the first data segment of the first data stream and a second coded value corresponding to the first data segment of the second data stream;
a second module, when operable within the computing device, causes the computing device to:
generate a received coded matrix to include a plurality of groups of selected coded values, wherein one of the plurality of groups of selected coded values includes at least the first and second coded values;
a third module, when operable within the computing device, when the received coded matrix includes a decode threshold number of pairs of coded values, causes the computing device to:
generate a data matrix from the received coded matrix and an encoding matrix;
a fourth module, when operable within the computing device, causes the computing device to:
reproduce the first data segment of the first data stream from a first plurality of data blocks of the data matrix and reproduce the first data segment of the second data stream from a second plurality of data blocks of the data matrix, wherein the first data segment of the first data stream and the first data segment of the second data stream maintain a time alignment of the first and second data streams.

9. The storage module of claim 8 further comprises:
the third module functions to generate the coded matrix based on a request from a requesting entity.

10. The storage module of claim 8 further comprises:
the third module functions to generate coded matrix based on capabilities of a requesting entity.

11. The storage module of claim 8 further comprises:
the first data stream corresponding to a first recording of an environment from a first recording device; and
the second data stream corresponding to a second recording of the environment from the first recording device.

12. The storage module of claim 8 further comprises:
the fourth module is further operable to determine the time alignment of the first data segments of the first and second data streams by at least one of:
interpreting time-stamp information; and
interpreting naming information of the first data segment of the first and second, data streams.

13. The storage module of claim 8 further comprises:
the third module is further operable to:
receive a request from a requesting entity for one or more additional groups of selected coded values;
generate the one or more additional groups of selected coded values utilizing the received coded matrix; and
the fourth module is further operable to output the one or more additional groups of selected coded values to the requesting entity.

14. The storage module of claim 8, wherein the first data segment of the first data stream is divided into a first plurality of data blocks and the first data segment of the second data stream is divided into a second plurality of data blocks, wherein the first and second plurality of data blocks create the data matrix.

15. A method for execution by one or more processing modules of one or more computing devices of a storage network (SN), the method comprises:
receiving a first plurality of pairs of coded values corresponding to first data segments of a first data stream and a second data stream, wherein a pair of coded values of the first plurality of pairs of coded values includes a first coded value corresponding to the first data segment of the first data stream and a second coded value corresponding to the first data segment of the second data stream;
receiving a second plurality of pairs of coded values corresponding to first data segments of a third data stream, wherein a pair of coded values of the second plurality of pairs of coded values includes a third coded value corresponding to the first data segment of the third data stream, wherein the first data segments of the first, second and third data streams are time aligned;
generating a received coded matrix to include a plurality of groups of selected coded values, wherein one of the plurality of groups of selected coded values includes at least two of the first, second and third coded values; and
when the received coded matrix includes a decode threshold number of pairs of coded values:
generating a data matrix from the received coded matrix and an encoding matrix;
reproducing the first data segment of the first data stream from a first plurality of data blocks of the data matrix;
reproducing the first data segment of the second data stream from a second plurality of data blocks of the data matrix;

reproducing the first data segment of the third data stream from a third plurality of data blocks of the data matrix, wherein the first data segment of the first data stream, the first data segment of the second data stream and the first data segment of the third data stream maintain the time alignment of the first, second and third data streams.

16. The method of claim 15 further comprises:
generating the received coded matrix based on a request from a requesting entity.

17. The method of claim 15 further comprises:
generating the received coded matrix based on capabilities of a requesting entity.

18. The method of claim 15 further comprises:
the first data stream corresponding to a first recording of an environment from a first recording device;
the second data stream corresponding to a second recording of the environment from the first recording device; and
the third data stream corresponding to a second recording of the environment from the first recording device.

19. The method of claim 15 further comprises:
determining the time alignment of the first data segments of the first, second and third data streams by at least one of:
  interpreting time-stamp information; and
  interpreting identification information of the first data segment of the first and second data streams.

* * * * *